United States Patent [19]
McEachern et al.

[11] Patent Number: 5,212,441
[45] Date of Patent: May 18, 1993

[54] HARMONIC-ADJUSTED POWER FACTOR METER

[75] Inventors: Alexander McEachern, Oakland, Calif.; W. Mack Grady, Round Rock, Tex.

[73] Assignee: Basic Measuring Instruments, Inc., Foster City, Calif.

[21] Appl. No.: 841,392

[22] Filed: Feb. 25, 1992

[51] Int. Cl.$^5$ .................... G01R 21/06; G01R 21/133
[52] U.S. Cl. .................................. 324/142; 324/141; 364/483
[58] Field of Search ................... 324/142, 141, 103 R, 324/116; 364/483

[56] References Cited

U.S. PATENT DOCUMENTS

| | | | |
|---|---|---|---|
| 4,034,233 | 7/1977 | Leyde | 324/103 R |
| 4,075,699 | 2/1978 | Schneider et al. | 324/103 R |
| 4,615,009 | 9/1986 | Battocletti et al. | 364/183 |
| 4,672,555 | 6/1987 | Hart et al. | 364/483 |
| 4,714,893 | 12/1987 | Smith-Vaniz | 324/126 |
| 4,794,369 | 12/1988 | Haford | 341/166 |
| 4,814,696 | 3/1989 | Kern et al. | 324/142 |
| 4,884,021 | 11/1989 | Hammond et al. | 324/142 |
| 4,937,520 | 6/1990 | Arseneau et al. | 324/141 |
| 4,980,634 | 12/1990 | Mallinson | 324/142 |

OTHER PUBLICATIONS

Recommended Practice for Establishing Transformer Capability when Supplying Nonsinusoidal Load Currents ANSI/IEEE C57.100-1986.

IEEE Guide for Harmonic Control and Reactive Compensation of Static Power Converters, ANSI/IRRR Std 519-1981.

*Primary Examiner*—Ernest F. Karlsen
*Attorney, Agent, or Firm*—Haverstock, Medlen & Carroll

[57] ABSTRACT

An electric power measuring system wherein power factor measurements are adjusted to reflect the adverse economic effects of harmonic currents and voltages. Well-known techniques are used to acquire frequency spectra that represent the voltages and currents present at the measuring point. These spectra are weighted in such a way that non-fundamental currents are increased and non-fundamental voltages are decreased. The weighted spectra are used to calculate a harmonic-adjusted volt-ampere measurement, which is then accumulated to form a harmonic-adjusted volt-ampere-hour measurement. The weighting functions for voltage and current are selected to approximate the economic impact on the AC power generating, transmission, and distribution system of non-fundamental currents and voltages. The resulting harmonic-adjusted volt-ampere-hour measurement is used to calculate a harmonic-adjusted power factor measurement.

5 Claims, 5 Drawing Sheets

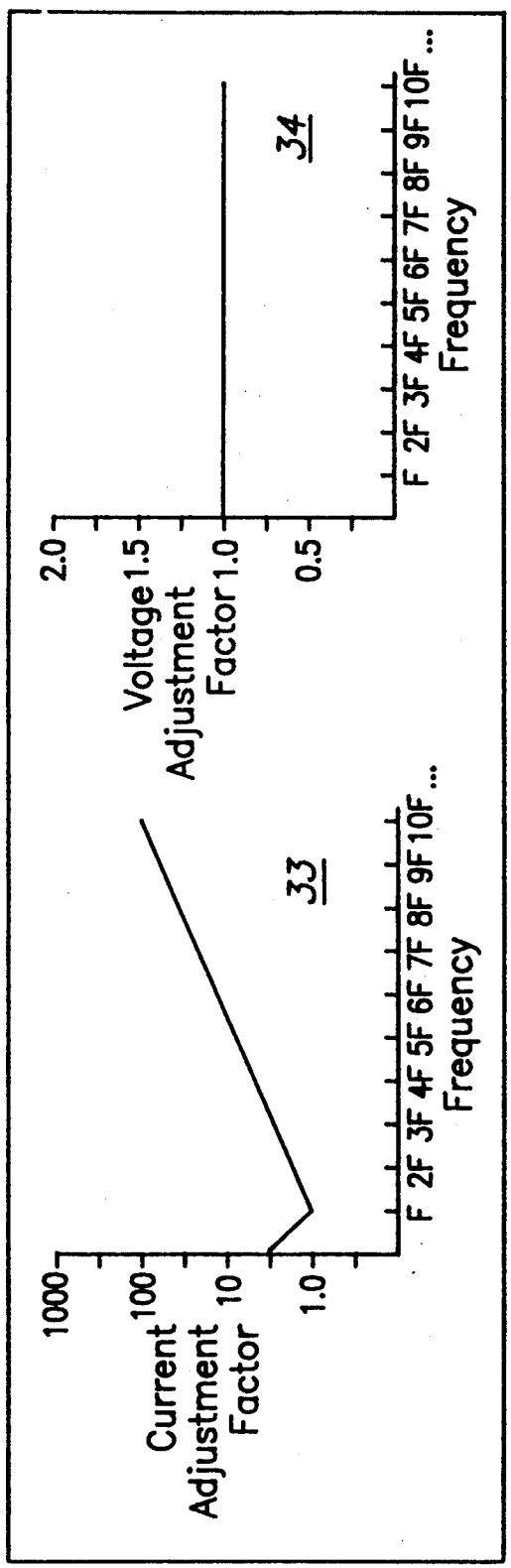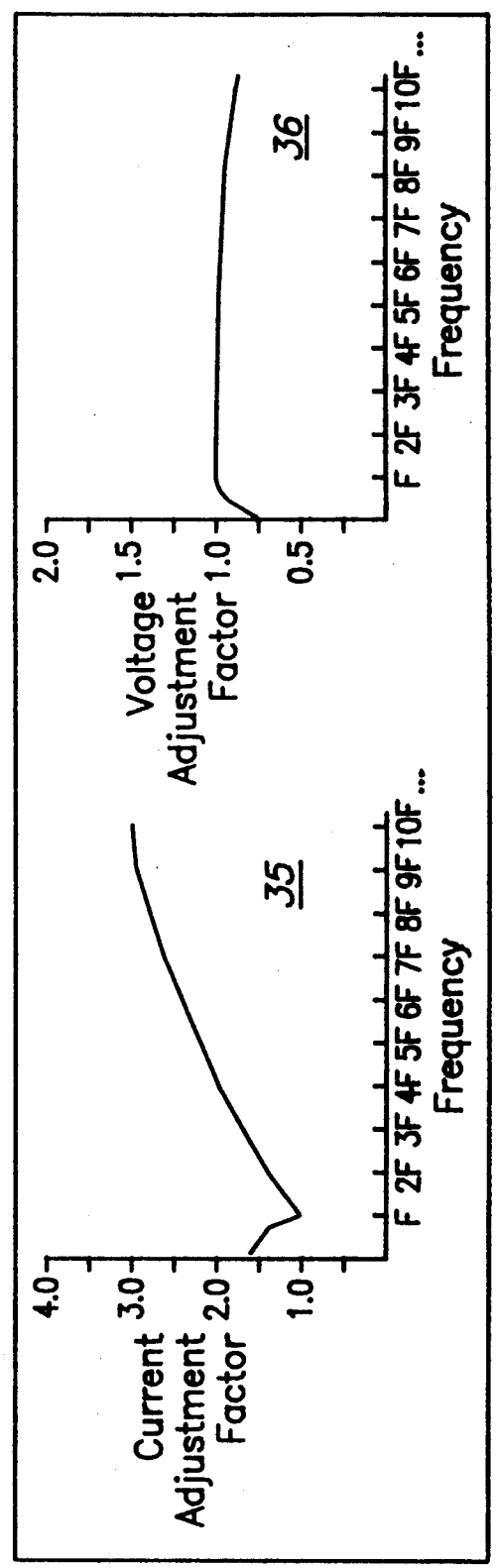
FIG. 3
FIG. 4

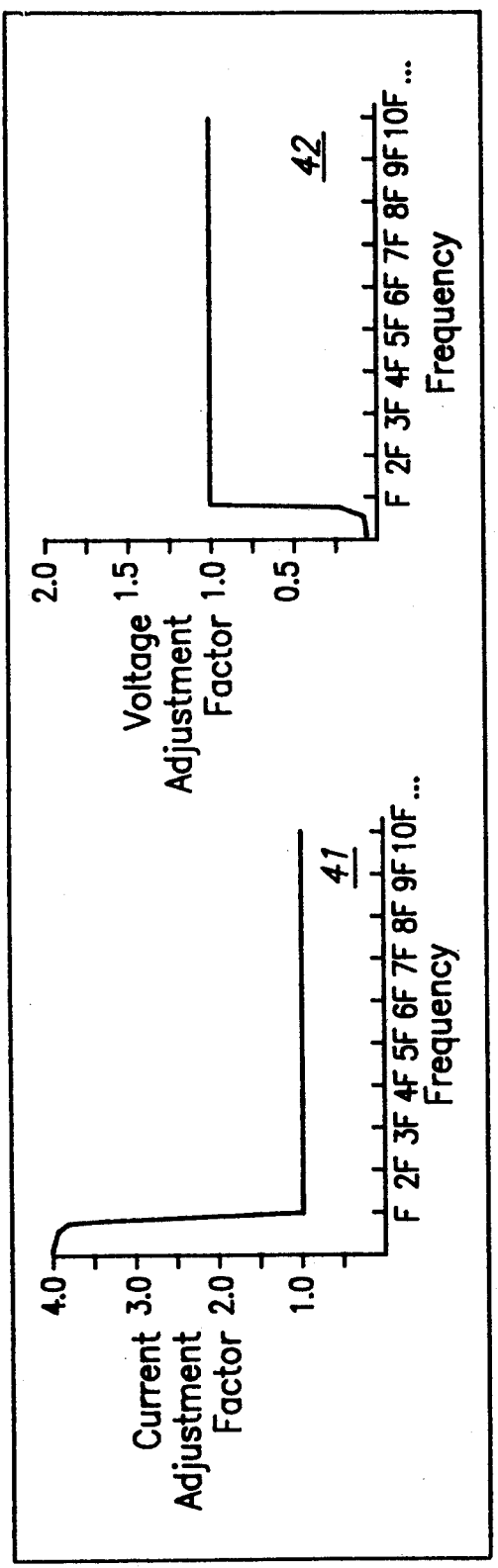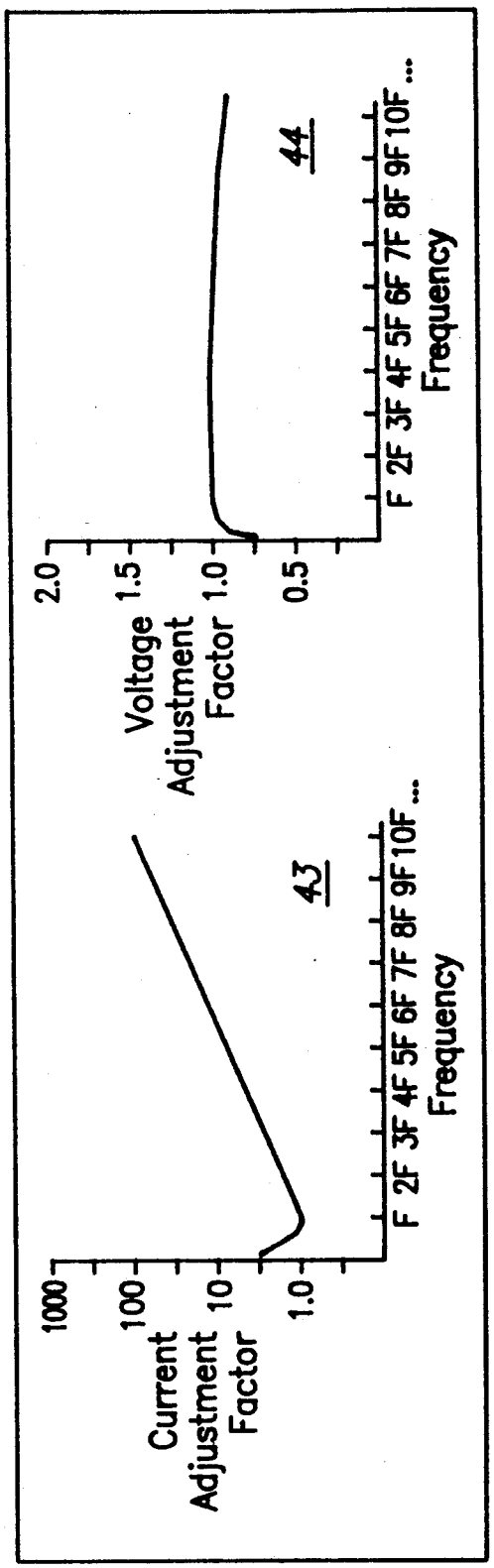
FIG. 7
FIG. 8

HARMONIC-ADJUSTED POWER FACTOR METER

BACKGROUND OF THE INVENTION

1. Field of the Invention

This invention relates to the field of electric power measuring devices. More specifically, this invention relates to the accumulating and recording of power factor and volt-amperes on single-phase and poly-phase AC power systems.

2. Description of the Prior Art

Electric power is ordinarily delivered to residences, commercial facilities, and industrial facilities as an Alternating Current (AC) voltage that approximates a sine wave with respect to time, and ordinarily flows through the facility as an AC current that also approximates a sine wave with respect to time. Ordinarily, a watt-hour meter is used to charge for the power that is consumed.

It is possible for an AC load to require large amounts of current for long periods of time at standard voltage, and still consume very few watt-hours. For example, a pure inductive load consumes no watt-hours but still demands current from the distribution system. To fairly allocate the costs of their system under this situation, most providers of electric power also measure volt-ampere-hours, directly or indirectly. The ratio of watt-hours to volt-ampere-hours is known as power factor, and is often used to adjust the economic charge for watt-hours.

Traditional power factor measurements relied on measuring the phase-shift between voltage and current, directly or indirectly. These measurements were accurate when both the voltage and the current were sinusoidal with respect to time. However, an increasing proportion of the industrial and commercial load base is made up of loads that draw non-sinusoidal current (for example, most adjustable speed drives, arc furnaces, and data processing systems). More recent power factor measuring instruments measure the ratio of watt-hours to volt-ampere-hours, and are accurate regardless of the waveform of the voltage or the current.

In an AC power distribution system, the expected fundamental frequency of voltage or current (usually 50 Hertz, 60 Hertz, or 400 Hertz) is usually referred to as the fundamental, regardless of the actual spectral amplitude peak. Integer multiples of this "fundamental" are usually referred to as harmonic frequencies, and spectral amplitude peaks at frequencies below the fundamental are often referred to as "sub-harmonics", regardless of their ratio relationship to the fundamental.

It is widely recognized that loads which draw harmonic currents place an increased economic burden on the power distribution system by requiring derated transformers, increased conductor area, installation of filters, and other actions. If the non-fundamental currents—harmonics or sub-harmonics—are large, relative to the impedance of the distribution system, they can induce harmonic voltages in the voltage delivered to other loads that share the distribution system.

Under these circumstances, even power factor measurements fail to accurately measure the economic impact of the load. The economic impact of such a consumer can negatively impact other users or the distribution system.

For example, on a system designed for 60 Hz power transmission and distribution, an accurate power factor measurement treats 100 amperes at 60 Hertz in exactly the same way as 100 amperes at 540 Hertz, although the latter almost certainly requires a larger investment by the power provider in transformer rating and conductor size.

Harmonic adjustments to power factor measurements provide a better estimate of the economic impact of a non-linear load.

BRIEF DESCRIPTION OF THE DRAWINGS

FIG. 3, FIG. 4, FIG. 5, FIG. 6, FIG. 7 and FIG. 8 show graphs for six examples of adjustment factors that are important to the functioning of the invention.

DETAILED DESCRIPTION OF A PREFERRED EMBODIMENT

Figure 1:
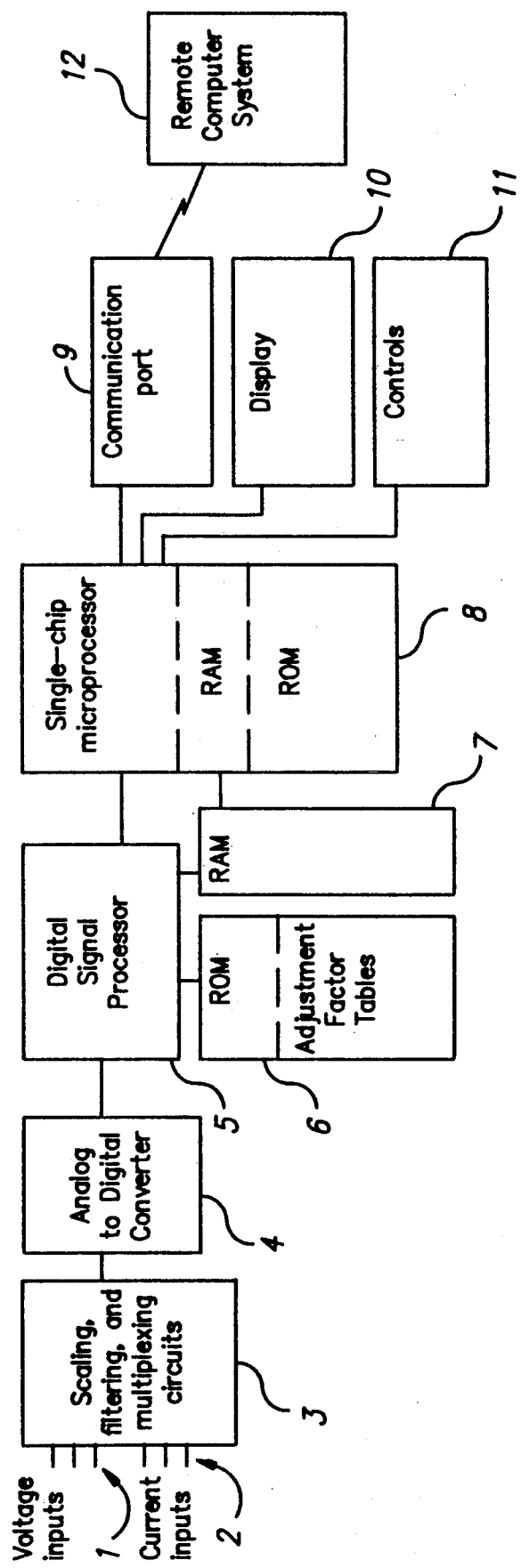
FIG. 1 shows a block diagram of an apparatus operating in accordance with an embodiment of the invention.

Beginning at the far left of FIG. 1, three voltages 1 from an AC power system and corresponding currents 2 are sensed. The sensed voltages 1 and currents 2 are applied to circuits 3 that employ well-known techniques to scale the voltages and currents to an appropriate level for further processing, filter out undesired frequencies, and multiplex the signals to an Analog-to-Digital converter 4.

Using any well-known technique, the digital signal processor 5 employs a program stored in its associated ROM memory 6 to calculate the power in watts represented by the voltage and current signals. The digital signal processor 5 calculates the frequency spectra for each voltage and current, using a Fourier transform or any other well known algorithm and then adjusts the spectra according to the process shown in FIG. 2, employing a table of frequency adjustments. Examples of such adjustment tables are shown in FIG. 3 through FIG. 8. The adjustment tables are stored in a ROM memory 6 or a RAM memory 7 for making appropriate interpolations where necessary.

Figure 2:
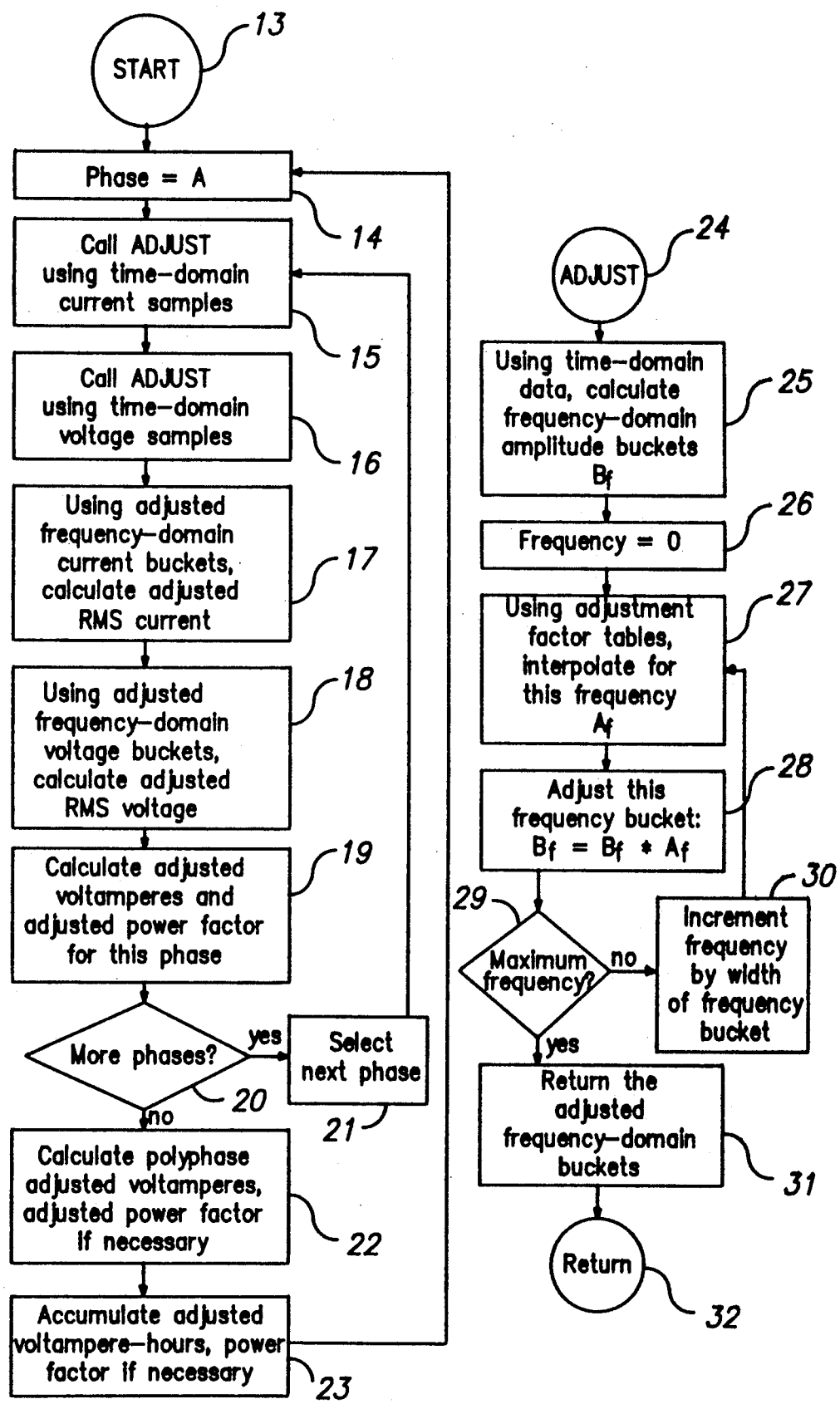
FIG. 2 shows a flow diagram of the key algorithm of the invention.
Figures 5, 6:
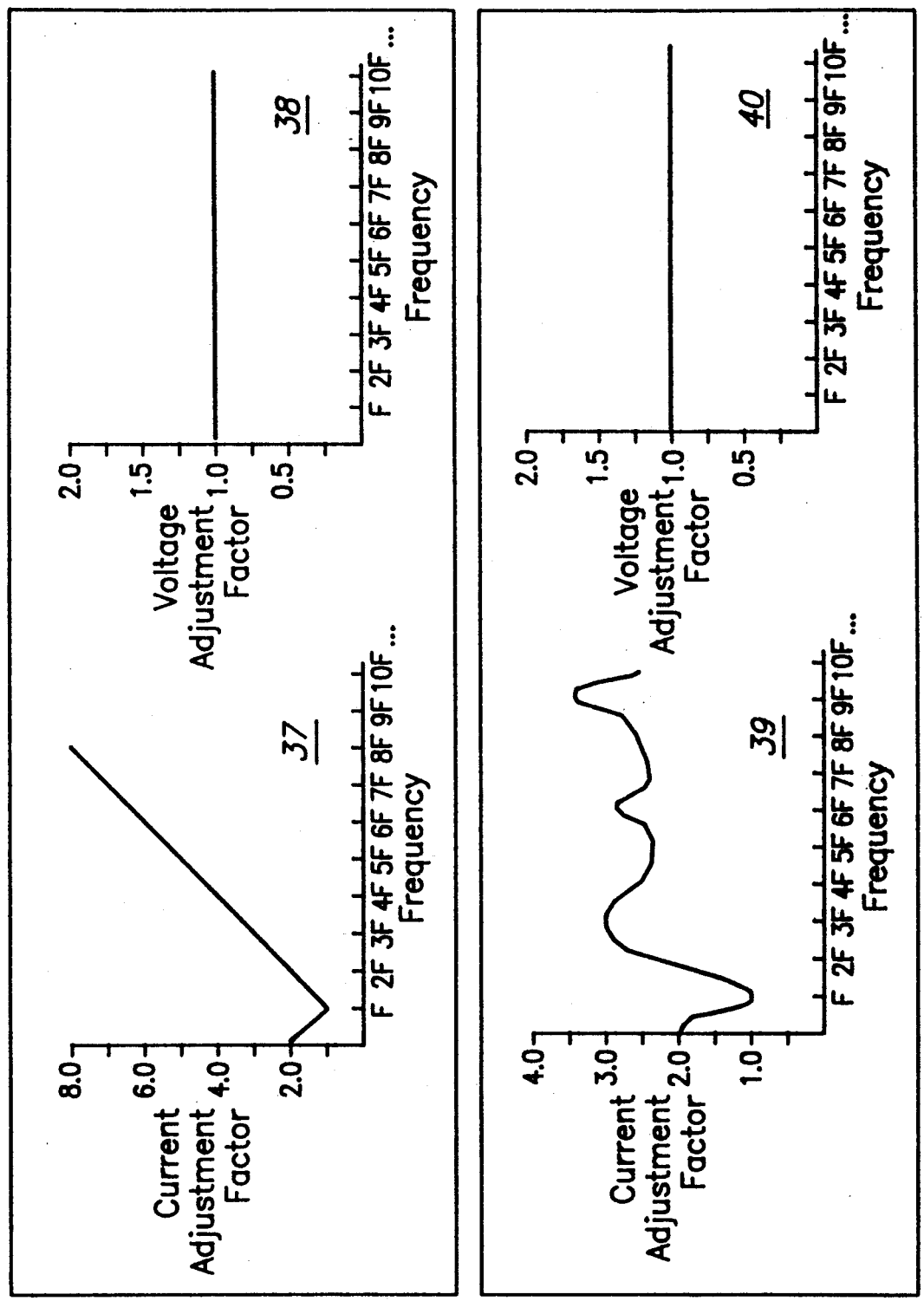

The digital signal processor 5 then calculates the harmonic-adjusted volt-ampere value according to the process shown in FIG. 2, and transmits it and the watt value to the single-chip microprocessor 7 which incorporates internal timers, communication channels, program memory, and data memory. The microprocessor 7 then accumulates the volt-ampere measurement in a volt-ampere-hour register, and the watt measurement in a watt-hour register. The microprocessor 7 also calculates the harmonic-adjusted power factor by calculating the ratio of watt-hours to harmonic-adjusted volt-ampere-hours. It displays the results in a display 8. An interface 9 allows any other digital system to read the present harmonic-adjusted volt-ampere value, the present watt value, the present harmonic adjusted power factor and to read and reset the various registers.

With some sacrifice in performance, all functions performed by the Digital Signal Processor 5 and its associated ROM memory 6 and RAM memory 7 can be performed by the microprocessor 8.

The circuits 3 through 8, or any parts thereof, may be included in a single integrated circuit.

The circuits 3 through 8, or any parts thereof, may perform other functions in addition to the functions described above, such as measuring and accumulating other parameters related to power flow.

The circuits 3 through 8 and the process of FIG. 2 can be implemented using analog filters, multipliers, adders, and integrators to replace digital data processing.

Various other modifications can be made to the preferred embodiment without departing from the spirit and scope of the invention as defined by the appended claims.

The flow diagram in FIG. 2 shows the algorithm of the invention. In the preferred embodiment of the invention, the algorithm of FIG. 2 is executed by the Digital Signal Processor 5 of FIG. 1, with the exception of block 23 which is executed by the Single-chip microprocessor 8 of FIG. 1. Beginning at Start 13, the algorithm is applied to the first phase of a polyphase system 14. The time-domain samples from the Analog to-Digital converter 4 of the current waveform are passed by a call 15 to subroutine ADJUST 24, which returns a corresponding set of frequency-domain current buckets whose amplitude has been adjusted using a Current Adjustment Factor table, such as the ones shown in FIG. 3 through FIG. 8. Each bucket corresponds to a particular frequency-domain response.

In the block 17, the process uses the harmonic-adjusted frequency-domain current buckets to calculate the harmonic-adjusted RMS current, using any well-known algorithm. In the preferred embodiment, the adjustment is made by the digital signal processor 5 using subroutine adjust 24 explained in more detail below. Blocks 16 and 18 of the process perform an identical function for the voltage waveform, yielding a harmonic-adjusted RMS voltage.

Block 19 takes the product of the harmonic-adjusted RMS voltage and the harmonic adjusted RMS current, thus forming the harmonic-adjusted volt-amperes for this phase. The block 19 applies any well-known algorithm to the time-domain voltage and time-domain current samples to calculate the power in watts and then calculates the harmonics-adjusted power factor as the ratio of watts to harmonic-adjusted volt-amperes. In a polyphase system, the blocks 20 and 21 cause similar calculation to be performed on additional phases, and the block 22 uses any well-known technique to accumulate a polyphase harmonic-adjusted volt-ampere and polyphase harmonic-adjusted power factor. Block 23 accumulates over time the harmonic-adjusted volt-ampere and harmonic-adjusted power factor, forming harmonic-adjusted volt-ampere-hours and time-averaged harmonic-adjusted power factor.

Turning now to subroutine ADJUST 24, the subroutine begins by accepting time-domain sampled data and then calculates the corresponding frequency-domain buckets using any well-known algorithm such as the Fourier transform. Blocks 26, 27, 28, 29, and 30 then scan the buckets, adjusting each bucket's amplitude based on the bucket's frequency and the corresponding adjustment factor found in the tables of FIG. 3 through FIG. 8. The adjusted frequency domain buckets are returned to the main algorithm in blocks 31 and 32.

The pairs of graphs in FIGS. 3a and 3b through FIGS. 8a and 8b show six examples of possible adjustment factors. Each of these figures takes a form similar to that of FIGS. 3a and 3b, in which the Current Adjustment Factor 33 is graphed against frequency expressed as multiples of the fundamental frequency, and the Voltage Adjustment Factor 34 is also graphed against frequency expressed as multiples of the fundamental frequency.

FIGS. 3a and 3b show adjustment factors that would be appropriate where the economic costs of harmonic currents 33 rise with the square of the frequency, and where the economic disadvantage of distorted voltage 34 is minimal. FIGS. 4a and 4b show adjustment factors that would be appropriate where economic costs of harmonic currents 35 rise with the square root of the frequency, and where there is some economic disadvantage 36 of higher voltage harmonics. FIGS. 5a and 5b show adjustment factors that would be appropriate when economic costs of harmonic currents 37 rise linearly with frequency, and where the economic disadvantage of distorted voltage 38 is minimal. The sets of adjustment factors in FIG. 3a, FIG. 3b, FIG. 4a, FIG. 4b, FIG. 5a and FIG. 5b would each be appropriate with certain types of transformers operating at different points on their operating curve.

FIGS. 6a and 6b show adjustment factors that would be appropriate where the economic costs of harmonic currents 39 at multiples of the third harmonic are high, as is typical when a delta-wye transformer is supplying the meter, and where the economic disadvantage of distorted voltage 40 is minimal. FIGS. 7a and 7b show current 41 and voltage 42 adjustment factors that would be appropriate when voltage flicker has a large economic impact. FIGS. 8a and 8b show current 43 and voltage 44 adjustment factors similar to FIGS. 3a and 3b, respectively, but also takes into account the economic desirability of the supplier delivering sinusoidal voltage.

Various other tables with different values of adjustment factors can be constructed without departing from the spirit and scope of the invention as defined by the appended claims

We claim:

1. An instrument for measuring electric power consumed by a consumer, comprising:
   a. first means for measuring watt consumption;
   b. second means for measuring volt-ampere consumption coupled to the means for measuring watt consumption;
   c. third means for calculating a frequency-domain power factor parameter comprising a function of a ratio of watt-hours to volt-ampere-hours coupled to receive a data signal from the first means and the second means; and
   d. fourth means for adjusting the power factor parameter in a predetermined manner related to the non-fundamental currents and non-fundamental voltages.

2. The instrument according to claim 1 wherein the first means and the second means include means for sensing time-domain current and the time-domain voltage.

3. The instrument according to claim 2 wherein the third means includes means for transforming the time-domain current into frequency-domain current and means for transforming time-domain voltage into frequency-domain voltage.

4. The instrument according to claim 3 wherein the fourth means includes means for storing a current-frequency adjustment table and a voltage-frequency adjustment table coupled to the means for adjusting.

5. The instrument according to claim 1 wherein the first, second, third and fourth means comprise a digital signal processor.

* * * * *